(12) United States Patent
Koh et al.

(10) Patent No.: US 7,799,635 B2
(45) Date of Patent: Sep. 21, 2010

(54) METHODS OF FORMING NONVOLATILE MEMORY DEVICES

(75) Inventors: Kwang-Wook Koh, Seoul (KR); Hee-Seog Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/476,698

(22) Filed: Jun. 2, 2009

(65) Prior Publication Data
US 2009/0239349 A1    Sep. 24, 2009

Related U.S. Application Data

(62) Division of application No. 11/704,003, filed on Feb. 8, 2007, now Pat. No. 7,557,404.

(30) Foreign Application Priority Data
Feb. 9, 2006    (KR) .................. 10-2006-0012710

(51) Int. Cl.
*H01L 21/336* (2006.01)
*H01L 21/8239* (2006.01)

(52) U.S. Cl. .............. 438/257; 438/258; 438/770; 257/E21.422

(58) Field of Classification Search ............. 438/211, 438/213, 257, 258, 265, 770; 257/E21.422, 257/E21.54
See application file for complete search history.

(56) References Cited

U.S. PATENT DOCUMENTS 6,495,467 B2   12/2002   Shin et al.
6,512,699 B2   1/2003    Ogane
6,774,428 B1   8/2004    Hung et al.
6,890,820 B2 *  5/2005    Yoon et al. .................. 438/257

(Continued)

FOREIGN PATENT DOCUMENTS

JP    2005-051277    2/2005

(Continued)

OTHER PUBLICATIONS

"Nonvolatile Memory Devices and Methods of Forming the Same" Specification, Drawings, and Prosecution History of U.S. Appl. No. 11/704,003, filed Feb. 8, 2007, by Kwang-Wook Koh, et al.

*Primary Examiner*—Tuan N. Quach
(74) *Attorney, Agent, or Firm*—Mills & Onello, LLP (57) ABSTRACT

In a nonvolatile memory device and a method of fabricating the same, a device isolation layer is formed defining an active region in a semiconductor substrate. A gate insulation layer and a first conductive layer are formed on the semiconductor substrate. A pair of stack patterns are formed, each having a intergate dielectric layer pattern and a second conductive layer pattern on the first conductive layer. A mask pattern is formed on the first conductive layer pattern between the stack patterns, the mask pattern being spaced apart from each of the stack patterns. The first conductive layer is patterned using the stack patterns and the mask patterns as an etching mask. Impurity ions are implanted into the active region to form a pair of nonvolatile memory transistors and a select transistor. The resulting nonvolatile memory device includes a memory cell unit that includes the pair of nonvolatile memory transistors and the select transistor.

10 Claims, 12 Drawing Sheets

U.S. PATENT DOCUMENTS

| | | |
|---|---|---|
| 6,897,115 B2 | 5/2005 | Cho et al. |
| 6,914,826 B2 | 7/2005 | Hung et al. |
| 6,951,782 B2 | 10/2005 | Ding |
| 6,952,031 B2 | 10/2005 | Yamauchi |
| 7,091,549 B2 * | 8/2006 | Rudeck et al. .............. 257/315 |
| 7,432,561 B2 | 10/2008 | Mizukami et al. |
| 7,615,497 B2 * | 11/2009 | Bok et al. ................... 438/736 |
| 2002/0052080 A1 * | 5/2002 | Lee ........................... 438/257 |
| 2005/0029577 A1 | 2/2005 | Nishizaka et al. |
| 2007/0138576 A1 | 6/2007 | Mizukami et al. |
| 2008/0272467 A1 * | 11/2008 | Bok et al. ................... 257/629 |

FOREIGN PATENT DOCUMENTS

| | | |
|---|---|---|
| KR | 1995-0015799 | 6/1995 |
| KR | 1020020067787 A | 8/2002 |
| KR | 1020040023857 A | 3/2004 |

\* cited by examiner

METHODS OF FORMING NONVOLATILE MEMORY DEVICES

CROSS-REFERENCE TO RELATED APPLICATIONS

This application is a divisional of U.S. application Ser. No. 11/704,003, filed on Feb. 8, 2007, U.S. Pat. No. 7,555,404 which relies for priority upon Korean Patent Application No. 10-2006-0012710, filed on Feb. 9, 2006, the contents of which are herein incorporated by reference in their entirety.

BACKGROUND OF THE INVENTION

Embodiments of the present invention disclosed herein relate to a semiconductor device, and more particularly, to a nonvolatile memory device.

A nonvolatile memory device retains data even in the event that externally applied power is removed. Examples of nonvolatile memory devices include a mask ROM, an erasable programmable read-only memory (EPROM), an electrically erasable programmable read only memory (EEPROM), and the like.

Figure 1A:
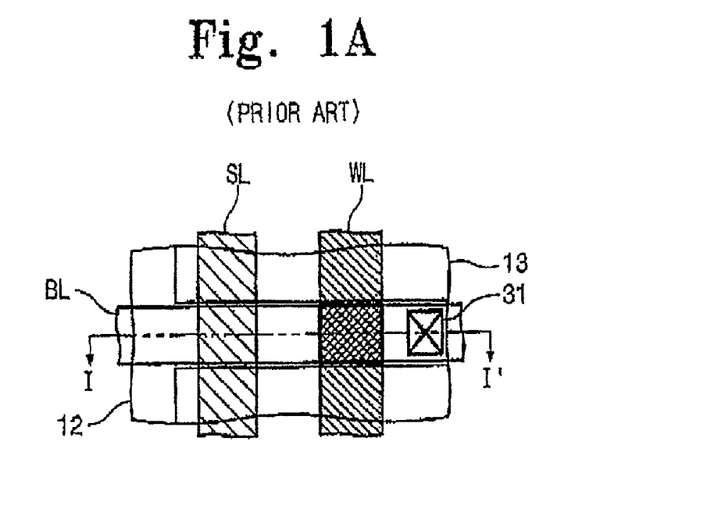
FIGS. 1A, 1B, and 1C are a plan view, a sectional view taken along line I-I' of FIG. 1A, and an equivalent circuit diagram of FIG. 1A, respectively, of a conventional EEPROM.
Figure 1B:
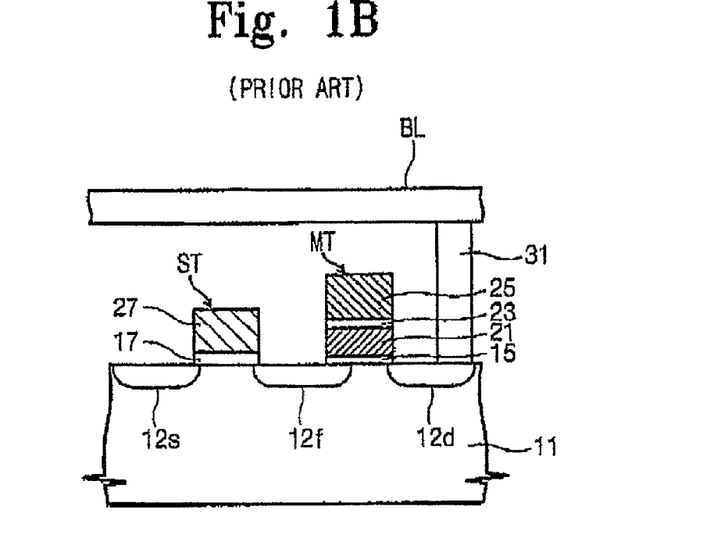
Figure 1C:
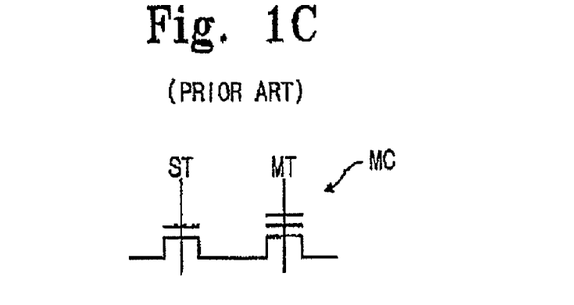

FIGS. 1A, 1B, and 1C are a plan view, a sectional view taken along line I-I' of FIG. 1A, and an equivalent circuit diagram of FIG. 1A, respectively, of a conventional EEPROM.

Referring to FIGS. 1A, 1B, and 1C, a source region 12s, a drain region 12d, and a floating diffusion region 12f are formed in an active region 12 defined by a device isolation layer 13 of a semiconductor substrate 11.

A word line WL crosses over the active region 12 in a first direction of extension. A select line SL that is spaced apart from the word line WL crosses over the active region in the first direction, and is parallel to the word line WL. A bit line BL that extends in a second direction is connected to the drain region 12d by a bit line contact plug 31.

A floating gate electrode 21, an intergate dielectric layer 23, and a control gate electrode 25 is formed on the active region 12 between the drain region 12d and the floating diffusion region 12f. A gate insulation layer 15 is interposed between the floating gate electrode 21 and the active region 12. The control gate electrode 25 is connected to a word line WL. The floating diffusion region 12f extends in the active region below the word line WL. The word line WL, the drain region 12d, and the floating diffusion region 12f constitute a memory transistor MT. A portion of the gate insulation layer 15 may include an opening that exposes the active region 12. A tunnel insulation layer (not shown) having a thickness that is less than that of the gate insulation layer may be formed on the opening.

A select gate electrode 27 is formed on the active region 12 between the floating diffusion region 12f and the source region 12s. A select gate insulation layer 17 is interposed between the select gate electrode 27 and the active region 12. The select gate electrode 27 is connected to a select line SL. The select line SL, the floating diffusion region 12f, and the source region 12s constitute a select transistor ST. Unlike the memory transistor MT, the select transistor ST may include a conventional metal-oxide semiconductor (MOS) transistor structure.

The select gate electrode 27 of the select transistor ST, and the floating gate electrode 21 and the control gate electrode 25 in the memory transistor MT can include a stacked structure of conductive layers, for example, that are electrically connected to each other.

In the conventional EEPROM, a memory cell unit MC includes one select transistor (ST) and one memory transistor (MT), and thus only one bit of data can be stored in each memory cell unit MC. Since the occupied active region area may be too large, this structure is not conducive to higher-integration.

SUMMARY OF THE INVENTION

Embodiments of the present invention provide a nonvolatile memory device and a method of formation thereof whereby the degree of integration can be improved.

In one aspect, nonvolatile memory device comprises: a semiconductor substrate having a device isolation layer defining an active region; a pair of nonvolatile memory transistors on the active region; a select transistor disposed between the pair of nonvolatile memory transistors; and floating diffusion regions on the active region between each of the nonvolatile memory transistors and the select transistor, wherein the select transistor includes a gate insulation layer having a thickness and a material that are same as those of a gate insulation layer of the nonvolatile memory transistor.

In an embodiment, the select transistor is spaced an identical distance apart from each of the pair of nonvolatile memory transistors.

In another embodiment, the nonvolatile memory device comprises a floating gate electrode, a control gate electrode, and a intergate dielectric layer on the gate insulation layer, the intergate dielectric layer interposed between the floating gate electrode and the control gate electrode.

In another embodiment, the floating gate electrode comprises a conductive layer of a material that is same as that of a select gate electrode of the select transistor.

In another embodiment, the select gate electrode is of a thickness that is less than that of the floating gate electrode.

In another embodiment, the select gate electrode has a middle portion that is recessed relative to edge portions thereof.

In another embodiment, the select gate electrode comprises an oxide layer formed thereon, the oxide layer having a middle portion that has a thickness that is greater than that of the edge portions.

In another embodiment, the control gate electrode has a length along a channel direction that is less than that of the floating gate electrode.

In another embodiment, the device further comprises sidewall spacers at sidewalls of the control gate electrode and the intergate dielectric layer, wherein sidewalls of the floating gate electrode in the channel direction are self-aligned relative to the sidewall spacers.

In another embodiment, the device further comprises: first and second drain regions at sides of each of the nonvolatile memory transistors opposite the floating diffusion regions; and first and second bit lines extending in a length direction of the active region and connected to the first and second drain regions, respectively, wherein the pair of nonvolatile memory transistors and the select transistor are arranged in the length direction of the active region.

In another embodiment, at least one of the first and second drain regions comprises an extension part extending in a second direction transverse the length direction of the active region.

In another embodiment, the extension part comprises two extension parts; the two extension parts are disposed on the first and second drain regions, respectively; and the two extension parts extend in respectively opposite directions, and are connected to the first and second bit lines, respectively.

In another aspect, a method of forming a nonvolatile memory device comprises: forming a device isolation layer defining an active region in a semiconductor substrate; forming a gate insulation layer and a first conductive layer on the semiconductor substrate; forming a pair of stack patterns, each having a intergate dielectric layer pattern and a second conductive layer pattern on the first conductive layer; forming a mask pattern on the first conductive layer pattern between the stack patterns, the mask pattern being spaced apart from each of the stack patterns; patterning the first conductive layer using the stack patterns and the mask patterns as an etching mask; and implanting impurity ions into the active region to form a pair of nonvolatile memory transistors and a select transistor.

In an embodiment, the mask pattern is spaced a same distance apart from each of the stack patterns of the pair of stack patterns.

In another embodiment, forming the first conductive layer further comprises forming a conductive layer pattern, comprising: forming a first conductive layer on the gate insulation layer; and patterning the first conductive layer to form an opening on the device isolation layer in a region where the stack pattern is to be formed.

In another embodiment, forming the stack pattern comprises: forming an insulation pattern on the second conductive layer pattern; and forming a first sidewall spacer at sidewalls of the intergate dielectric layer pattern, the second conductive layer pattern, and the insulation pattern.

In another embodiment, the first sidewall spacer is formed of an oxide layer.

In another embodiment, forming the mask pattern comprises: forming second sidewall spacers at sidewalls of the pair of stack patterns to expose a portion of the first conductive layer pattern between the pair of stack patterns; and forming a thermal oxide layer on the surface of the exposed first conductive layer pattern using a thermal oxidation process.

In another embodiment, forming the second sidewall spacer comprises: forming an anti-oxidation layer on the semiconductor substrate; forming a photoresist pattern on the anti-oxidation layer to expose a region between the pair of stack patterns; and performing an anisotropic etching process on the anti-oxidation layer using the photoresist pattern.

In another embodiment, the anti-oxidation layer comprises a silicon nitride layer.

In another embodiment, the pair of nonvolatile memory transistors and the select transistor are arranged along a length direction of the active region, the active region having a extension part in at least one side of the one pair of nonvolatile memory transistors, the extension part extending in a second direction transverse the length direction.

In another embodiment, the extension part comprises two extension parts, and wherein the two extension parts extend in the second direction in respectively opposite directions.

BRIEF DESCRIPTION OF THE FIGURES

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the figures:

FIGS. 5A through 11A are plan views illustrating processes of forming a nonvolatile memory device according to an embodiment of the present invention; and FIGS. 5B through 11B are sectional views illustrating processes of forming a nonvolatile memory device according to an embodiment of the present invention.

DETAILED DESCRIPTION OF EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete.

It will be understood that although the terms first and second are used herein to describe various regions, layers and/or sections, these regions, layers and/or sections should not be limited by these terms. These terms are only used to distinguish one region, layer or section from another region, layer or section. Thus, for example, a first circuit discussed below could be termed a second circuit, and similarly, a second circuit may be termed a first circuit without departing from the teachings of the present invention.

Unit Transistor Structure of Nonvolatile Memory Device

Figure 2A:
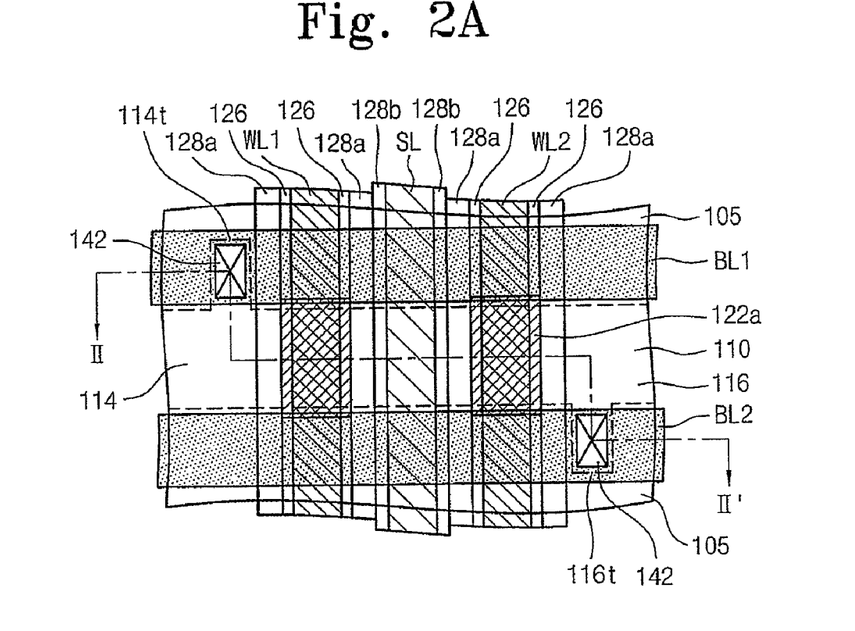
FIGS. 2A, 2B, and 2C are a plan view, a sectional view taken along line II-II' of FIG. 2A, and an equivalent circuit diagram of FIG. 2A, respectively, of a nonvolatile memory device according to an embodiment of the present invention.
Figure 2B:
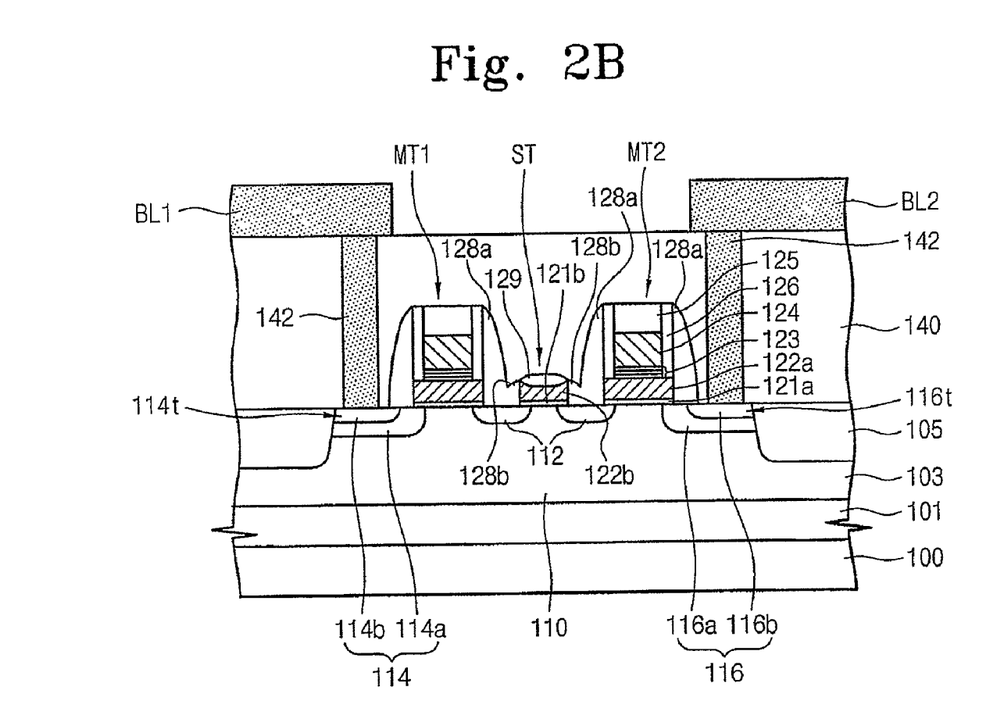
Figure 2C:
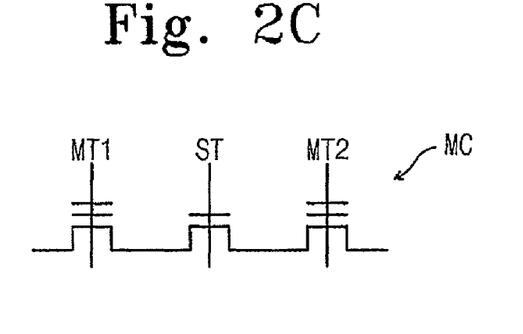
Figure 3:
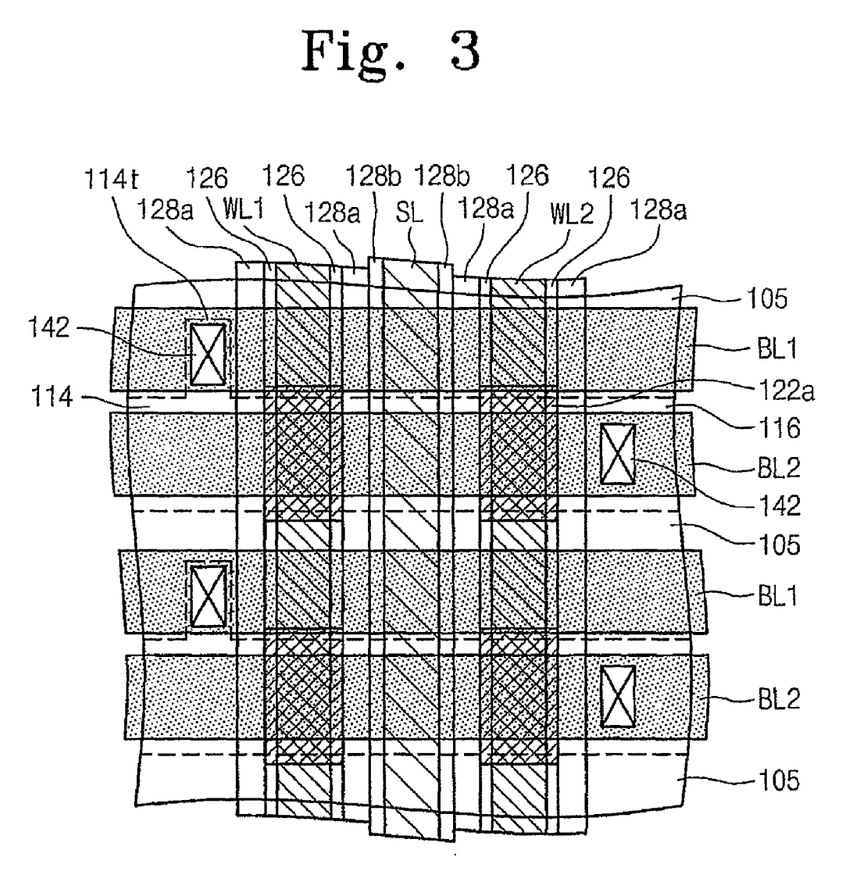
FIG. 3 is a plan view of a nonvolatile memory device according to a modified embodiment of the present invention.

FIGS. 2A, 2B, and 2C are a plan view, a sectional view taken along line II-II' of FIG. 2A, and an equivalent circuit diagram of FIG. 2A, respectively, of a nonvolatile memory device according to an embodiment of the present invention. FIG. 3 is a plan view of a nonvolatile memory device according to an embodiment of the present invention.

Referring to FIGS. 2A, 2B, and 2C, the nonvolatile memory device includes a memory cell unit MC having a first nonvolatile memory transistor MT1 and a second nonvolatile memory transistor MT2, which are spaced apart from each other on a semiconductor substrate. A single select transistor ST is disposed between the first nonvolatile memory transistor MT1 and the second nonvolatile memory transistor MT2. Accordingly, the memory cell unit MC is comprised of three transistors, including the two nonvolatile memory transistors MT1 and MT2 and one select transistor ST, and can operate in dual-bit format.

The semiconductor substrate 100 may be a substrate having a first conductivity-type (e.g., p-type). A deep well 101 having a second conductivity-type (e.g., n-type) opposite to the first conductivity-type may be formed in the semiconductor substrate 100. A plurality of first conductivity-type pocket wells 103 may be further formed in the deep wells 101. The memory cell unit MC is formed on the active region 110 defined by a device isolation layer 105 in the pocket wall 103 of the semiconductor substrate 100. The active region 110 may be provided in an oblong shape extending in one direction. The first nonvolatile memory transistor MT1, the select transistor ST, and the second nonvolatile memory transistor MT2 are disposed along the one direction of the active region 110. Floating diffusion regions 112 are formed in the active region 110 between the first nonvolatile memory transistor MT1 and the select transistor ST, and between the second nonvolatile memory transistor MT2 and the select transistor ST.

The nonvolatile memory transistors MT1 and MT2 are formed in a stacked structure, each including a floating gate electrode 122a, a intergate dielectric layer 123, and a control gate electrode 124. A first gate insulation layer 121a is interposed between the floating gate electrode 122a and the active region 110. The control gate electrodes 124 can be configured to intersect the active region 110 and are disposed in parallel to each other. The floating gate electrodes 122a can be disposed on a region where the active regions 110 intersect the control gate electrodes 124. The floating gate electrode 122a may be formed, for example, of a polycrystal silicon doped with impurity ions. The control gate electrode 124 may be formed of a polycrystal silicon doped with impurity ions or a stacked layer of the polycrystal silicon and a metal silicide layer. The first gate insulation layer 121a may include an opening that exposes the active region 110. A tunnel insulation layer (not shown) of a thickness that is less than that of the gate insulation layer may be formed on the opening. The gate insulation layer and the tunnel insulation layer can comprise a silicon oxide layer formed using a thermal oxidation process, and may be of a thickness of about 250 to 350 Å and a thickness of about 100 Å, respectively. The intergate dielectric layer 123 has a high dielectric constant, and may be an oxide-nitride-oxide (ONO) layer.

An insulation layer pattern 125 may be additionally formed on the stacked structure. The insulation layer pattern 125 may be a silicon oxide layer that is formed on the control gate electrode 124 using a chemical vapor deposition (CVD) method. A first sidewall spacer 126 formed of an oxide layer may be formed on both sides of the intergate dielectric layer 123, the control gate electrode 124, and the insulation layer pattern 125. The both sides of the floating gate electrode 122a may be self-aligned on the first sidewall spacer 126. Accordingly, the control gate electrode 124 may have a smaller length than the floating gate electrode 122a. The difference in length may be approximately equal to double the width of the first sidewall spacer 126.

The select transistor ST is self-aligned on and spaced a predetermined distance apart from the first nonvolatile memory transistor MT1 and the second nonvolatile memory transistor MT2. The select transistor ST includes a select gate electrode 122b interposing the second gate insulation layer 121b on the active region 110. The select gate electrode 122b extends in a direction so as to intersect the active region 110, and can be formed, for example, of a polycrystal silicon doped with impurity ions. The second gate insulation layer 121b may have a thickness and be formed of a material that are identical to those of the first gate insulation layer 121a. For example, the second gate insulation layer 121b may comprise a silicon thermal oxide layer. Since the select gate electrode 122b is formed using a process identical to that of the floating gate electrode 122a, it may include an impurity type and impurity concentration identical to those of the floating gate electrode 122a. The select gate electrode 122b may optionally be formed to a thickness that is less than that of the floating gate electrode 122a. For example, the select gate electrode 122b can be 1300 Å thick, and the floating gate electrode 122a can be 1500 Å thick. The select gate electrode 122b has a contoured top surface whereby the middle portion is lower than the edge portions. An oxide layer 129 may be formed on the top of the select gate electrode 122b. The oxide layer 129 can be formed to have a middle portion that is thicker than the edge portions. In one embodiment, the oxide layer 129 is 200 Å in thickness, or greater, and the sum of the thicknesses of the oxide layer 129 and the select gate electrode 122b can be larger than that of the floating gate electrode 122a.

Second sidewall spacers 128a are formed on both sides of the first nonvolatile memory transistor MT1 and the second nonvolatile memory transistor MT2. Third sidewall spacers 128b are formed on the both sides of the select transistor ST. The second sidewall spacer 128a and the third sidewall spacer 128b can be formed to cover the floating diffusion region 112. The second sidewall spacer 128a and the third sidewall spacer 128b can, for example, comprise an identical silicon oxide layer. First and second drain regions 114 and 116 are formed outside the first nonvolatile memory transistor MT1 and the second nonvolatile memory transistor MT2.

The first and second drain regions 114 and 116 may include low-concentration impurity regions 114a and 116a, and high-concentration impurity regions 114b and 116b.

Since the nonvolatile memory device of the present invention is configured to operate in a dual-bit configuration, it can be more highly integrated.

The nonvolatile memory device can further include first and second word lines WL1 and WL2, a select line SL, and first and second bit lines BL1 and BL2.

The first and second word lines WL1 and WL2 extend in a direction such that control gate electrodes of the first and second nonvolatile memory transistors MT1 and MT2 intersect the active region 110, respectively. The select line SL extends in a direction such that the select gate electrode 122b intersects the active region 110. The first and second bit lines BL1 and BL2 are connected to the first and second drain regions 114 and 116, respectively, through bit line contact plugs 142 that penetrate the interlayer insulation layer 140. The first and second bit lines BL1 and BL2 extend in the same direction as the direction of extension of the active region 120.

The first and second drain regions 114 and 116 of the memory cell unit MC may include a first extension part 114t and a second extension part 116t, which extend in a direction that is transverse to the direction of extension of the active region 120. The first extension part 114t and the second extension part 116t can, in one embodiment, extend in respectively opposite directions (see FIG. 2A). The first and second bit lines BL1 and BL2 are connected to the first and second extension parts 114t and 116t, respectively, and are disposed on a device isolation layer 105 that defines the active region 110.

Referring to the embodiment of FIG. 3, the first and second extension parts 114t and 116t can optionally formed at only one of the first drain region 114 and the second drain region 116. In this case, one of the bit lines BL1 and BL2 is formed on the device isolation layer 105, and the other is formed on the active region 110. Accordingly, this embodiment provides for a further degree of integration in the semiconductor device.

Figure 4A:
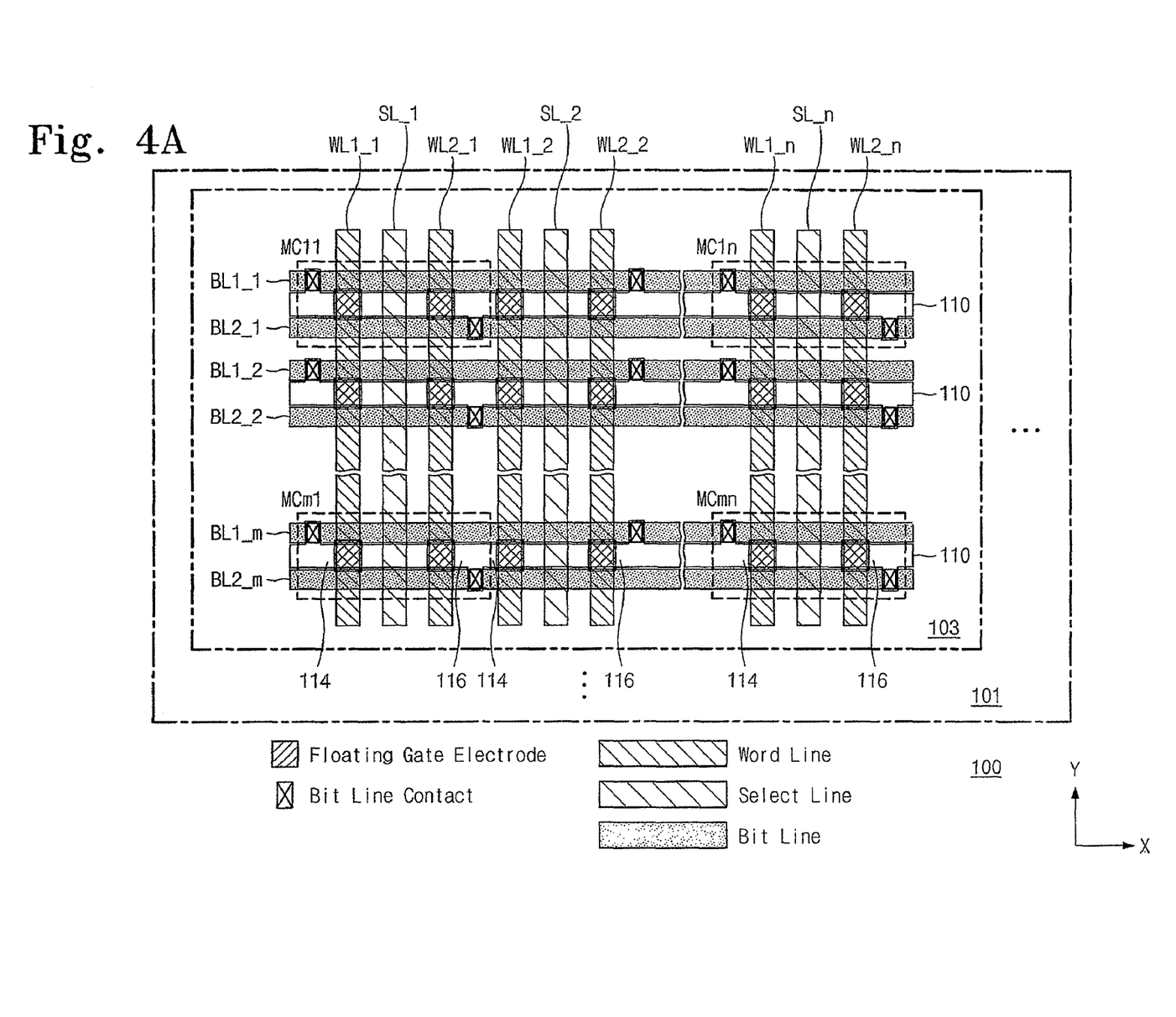
FIGS. 4A and 4B are an plan view of an example memory cell array of a nonvolatile memory device according to an embodiment of the present invention, and an equivalent circuit diagram of the memory cell array of FIG. 4A, respectively.
Figure 4B:
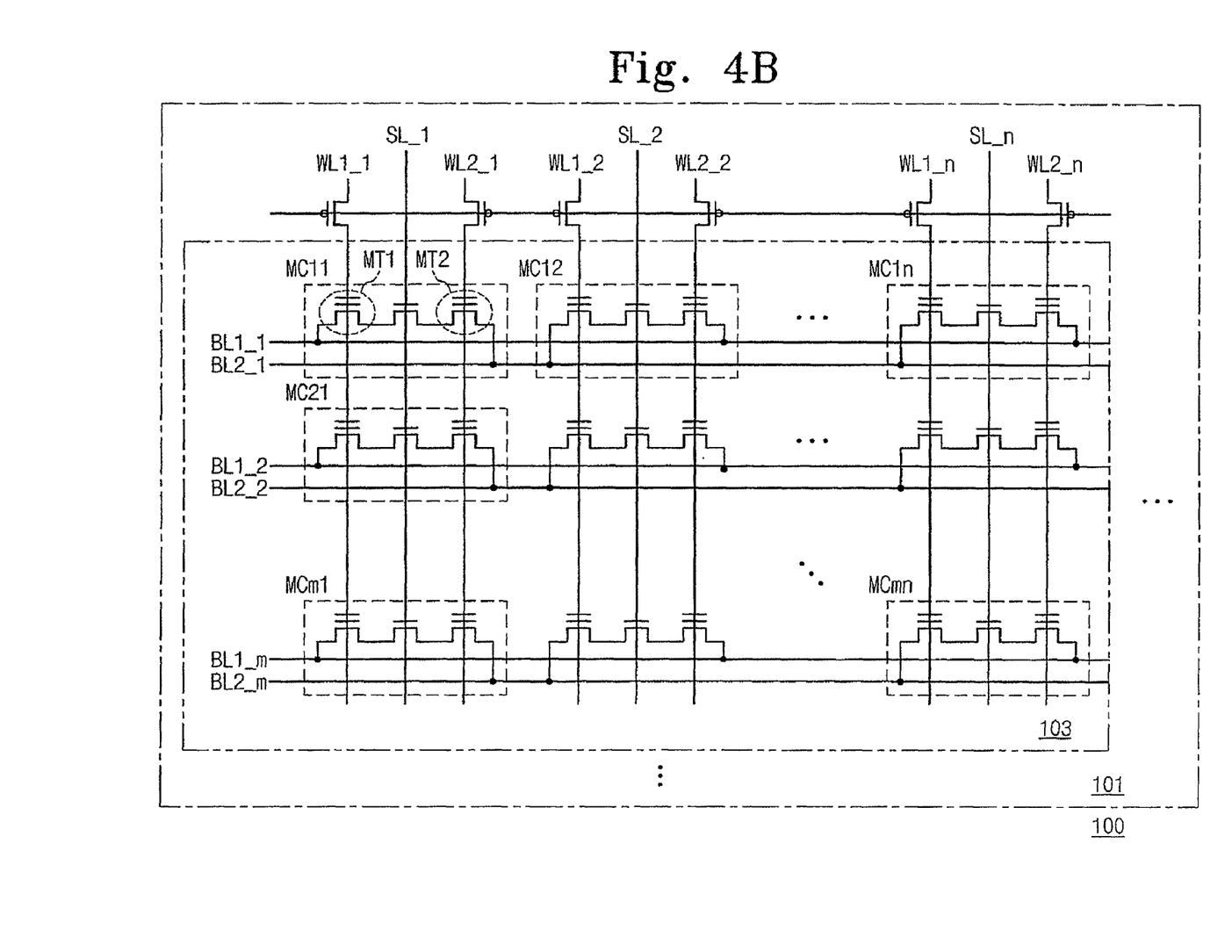

FIGS. 4A and 4B are an plan view of an example memory cell array of a nonvolatile memory device according to an embodiment of the present invention, and an equivalent circuit diagram of the memory cell array of FIG. 4A, respectively;

Referring to FIGS. 4A and 4B, the semiconductor substrate 100 may comprise a substrate having a first conductivity-type (e.g., p-type) material. A deep well 101 having a second conductivity-type (e.g., n-type) opposite to the first conductivity-type may be formed on the semiconductor substrate 100. A plurality of first conductivity-type pocket wells 103 may be further formed on the deep well 101 of the second conductivity-type. The active region 110 and the device isolation layer 105 may be formed on the pocket well 103.

A plurality of memory cell units MC11 to MCm1, MC12 to MCm2, . . . , MC1n to MCmn can be formed on the pocket well 103, in a matrix having a row direction (e.g., a bit line direction) and a column direction (e.g., a word line direction). A plurality of first word lines WL1_1 to WL1_n and second word lines WL2_1 to WL2_n (control gate electrodes) extend in the column direction and intersect the active regions 110 that extend in the row direction. The control gate electrodes disposed in a same column are electrically connected to an identical word line. The first and second word lines are connected to the control gate electrode of the first memory transistor MT1 and the control gate electrode of the second memory transistor MT2, respectively, as shown in FIGS. 2A to 2C. The floating gate electrodes are disposed on the regions where the active regions 110 intersect the word lines.

A plurality of first bit lines BL1_1 to BL1_m and second bit lines BL2_1 to BL2_m intersect the word lines and extend in a row direction in the direction of extension of the active regions 110. The bit lines are commonly connected to the first and second drain regions 114 and 116 of adjacent memory cell units MC, respectively. For example, the first bit lines BL1_1 to BL1_m are commonly connected to the first drain regions 114 of the odd-number memory cell units MC11 to MCm1, MC13 to MCm3, . . . in the row direction, and are also commonly connected to the second drain regions 116 of the even-number memory cell units MC12 to MCm2, MC14 to MCm4, . . . in the row direction. The second bit lines BL2_1 to BL2_n are commonly connected to the second drain regions 116 of the odd-number memory cell units MC11 to MCm1, MC13 to MCm3, . . . in the row direction, and are also commonly connected to the first drain regions 114 of the even-number memory cell units MC12 to MCm2, MC14 to MCm4, . . . in the row direction.

A plurality of select lines SL_1 to SL_n between the first and second word lines extend in a direction parallel to the word lines. For example, the select line SL_1 can be disposed between the first word line WL1_1 and the second word line WL_2. The select line SL_1 is connected to the select gate electrode 122b the memory units of the first column, as shown in FIGS. 2A and 2B.

PMOS transistors can be disposed in the n-type deep well 101 including the pocket well 102 and each word line WL1_n, WL2_n can operate independently.

Method of Manufacturing Nonvolatile Memory Device

FIGS. 5A through 11A are plan views illustrating processes of forming a nonvolatile memory device according to an embodiment of the present invention. FIGS. 5B through 11B are sectional views illustrating processes of forming a nonvolatile memory device according to an embodiment of the present invention.

Figure 5A:
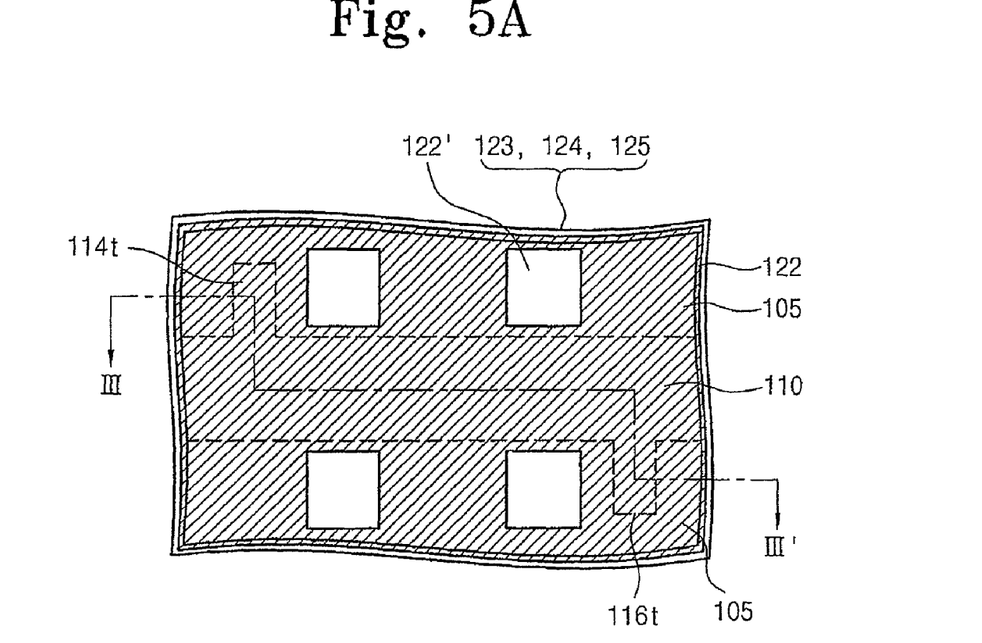
Figure 5B:
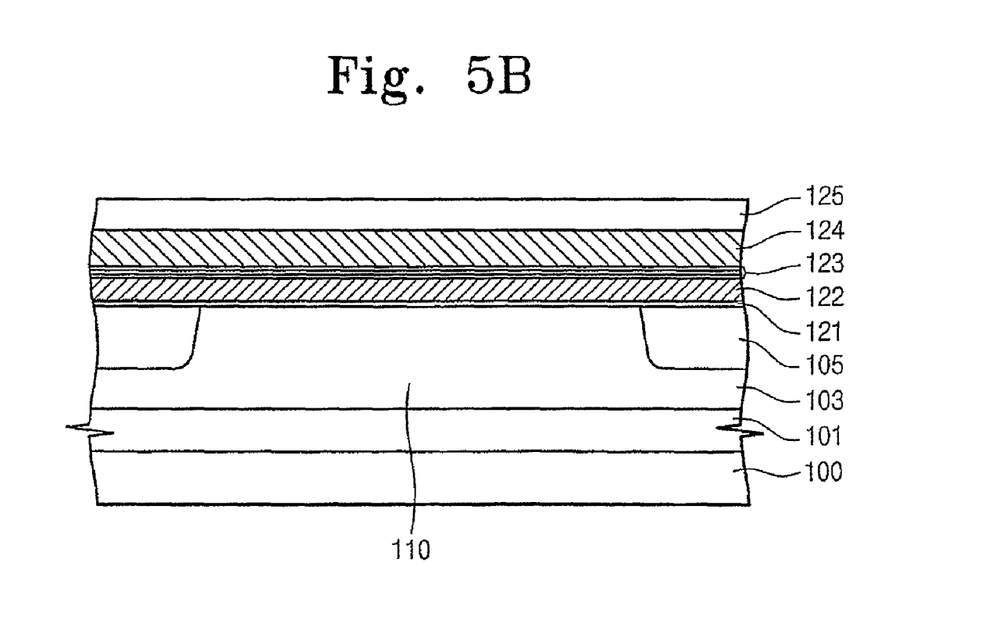

Referring to FIGS. 5A and 5B, the semiconductor substrate 100 can comprise a substrate having a first conductivity-type (e.g., p-type). A deep well 101 having a second conductivity-type (e.g., n-type) opposite to the first conductivity-type may be formed in the semiconductor substrate 100. A plurality of first conductivity-type pocket wells 103 may be further formed in the deep well 101. A device isolation layer 105 defining the active region 110 may be formed on the pocket well 103 of the semiconductor substrate 100. The device isolation layer 105 can, in one embodiment, be formed using a conventional shallow trench isolation (STI) process. The active region 110 can be formed in an oblong shape extending in one direction.

The active region 110 includes a first extension part 114t and a second extension part 116t, which extend in a direction that intersects the one direction of the active region 110. The first extension part 114t and the second extension part 116t can, in one embodiment, extend in respectively opposite directions. The extension parts 114t and 116t can each be formed on one of the first drain region 114 and the second drain region 116 (see FIGS. 2A and 3).

A gate insulation layer 121 and a first conductive layer are formed on the semiconductor substrate 100 having the active region 110. The gate insulation layer 121 comprises, in one embodiment, a silicon oxide layer formed using a thermal oxidation process, and can be formed to a thickness of 100 Å, for example. The first conductive layer may be formed of a polycrystal silicon doped with second conductivity-type impurity ions. The first conductive layer can be formed, for example, to a thickness of 1500 Å. A region of the first conductive layer is patterned in a region to form a first conductive layer pattern 122, for example, the region can be formed in a location where the nonvolatile memory transistor MT is to be formed and can exclude a portion where the floating gate electrode is to be formed. Accordingly, the first conductive layer pattern 122 includes opening 122' on the device isolation layer 105 in a region where a stacked pattern 120 of the nonvolatile memory transistor MT is to be formed (see FIGS. 6A and 6B below).

Next, an intergate dielectric layer 123, a second conductive layer 124, and a mask insulation layer 125 are formed on the first conductive pattern 122. The intergate dielectric layer 123 can be configured to induce a predetermined voltage in a floating gate in response to a voltage applied to the control gate electrode 124, and can comprise a dielectric layer having a larger dielectric constant than the gate insulation layer 121. The integrate dielectric layer 123 can, for example, comprise an ONO layer in which a silicon oxide layer, a silicon nitride layer, and a silicon oxide layer are sequentially stacked. The second conductive layer 124 can be formed of a polycrystal silicon doped with impurity ions, or a stacked arrangement of the polycrystal silicon and a metal silicide layer. The mask insulation layer 125 may be used as a mask to pattern the second conductive layer 124, and to protect underlying portions of the second conductive layer from various subsequent processes. The mask insulation layer 125 can comprise for example, a silicon oxide layer that is formed using a CVD method.

Figure 6A:
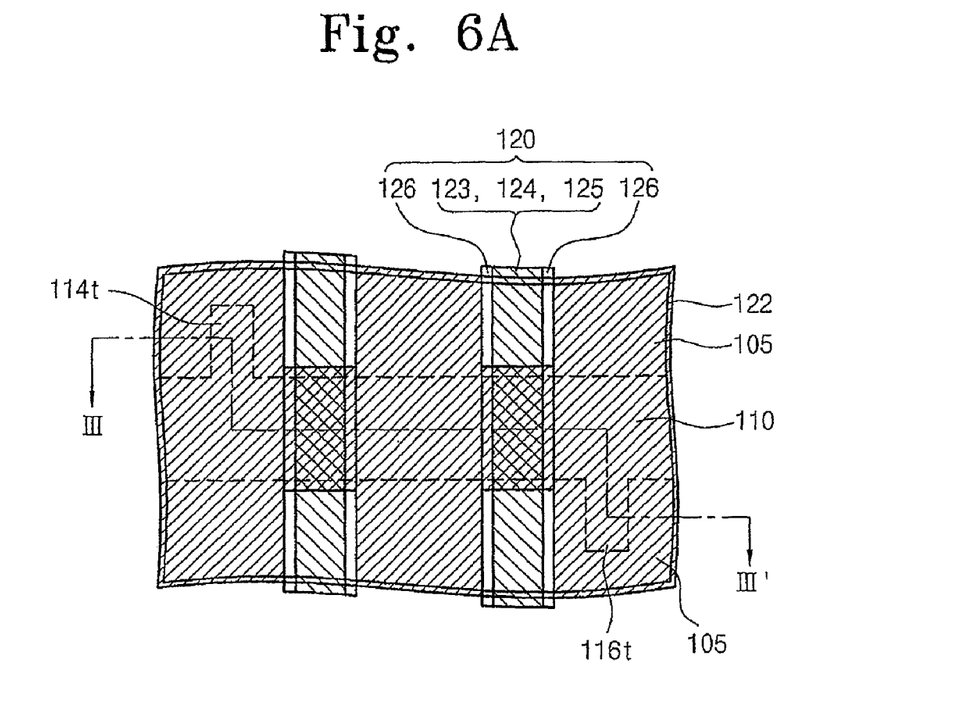
Figure 6B:
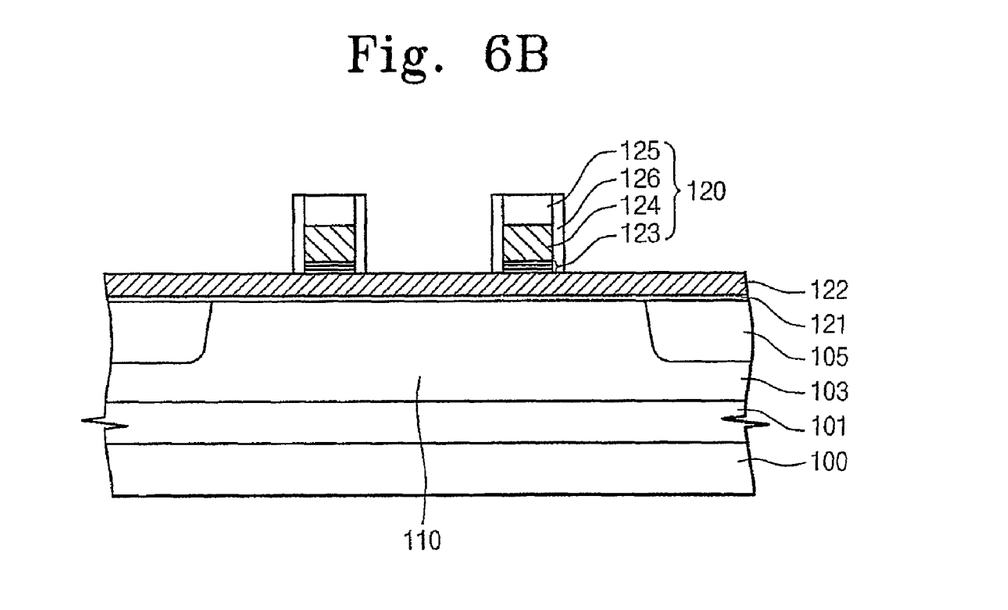

Referring to FIGS. 6A and 6B, the mask insulation layer is patterned using a predetermined photoresist pattern (not shown) as an etching mask to form a pair of mask insulation patterns 125 spaced a predetermined distance apart from each other. The second conductive layer 124 and the intergate dielectric layer 123 are patterned using the photoresist pattern and the mask insulation patterns 125 as an etching mask to expose the first conductive pattern 122. After removing the photoresist pattern, a first sidewall spacer 126 is formed on both sidewalls of the intergate dielectric pattern 123, the second conductive layer pattern 124, and the mask insulation patterns 125. To form the sidewall spacers 126, a silicon oxide layer can be formed on an entire surface of the semiconductor substrate using a CVD method, and then the first sidewall spacers 126 are formed using an etch back process on the silicon oxide layer. The first sidewall spacer 126 may have an appropriate thickness to prevent the intergate dielectric layer pattern 123 and the second conductive layer pattern 124 from being damaged during subsequent processes. Thus, the intergate dielectric layer pattern 123, the second conductive layer pattern 124, and the mask insulation patterns 125 are stacked, and the first sidewall spacer 126 is formed on the both sides thereof. Members of each pair of the stack patterns 120 are spaced apart from each other.

Figure 7A:
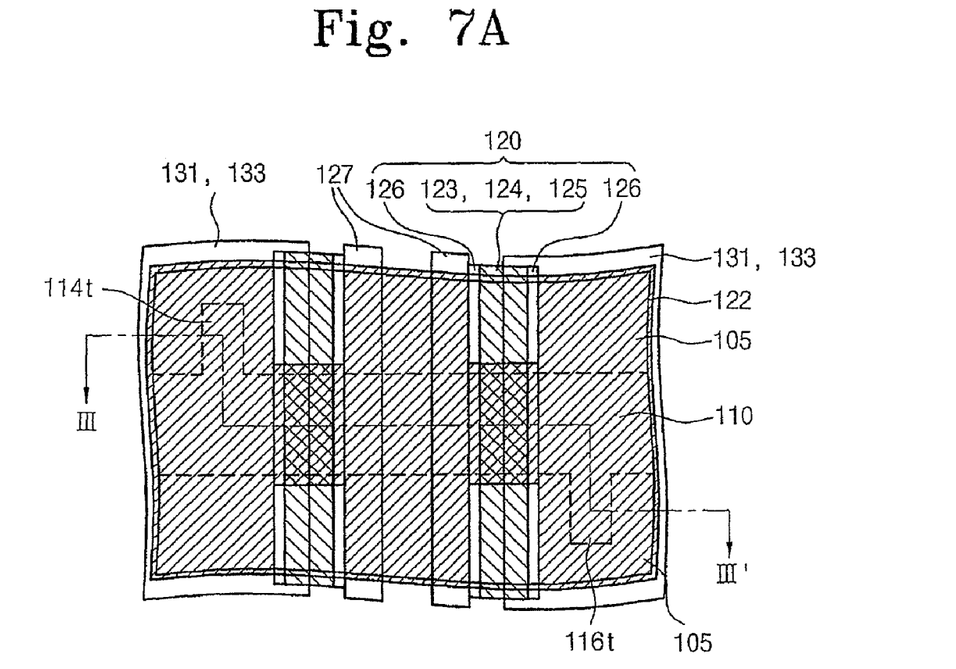
Figure 7B:
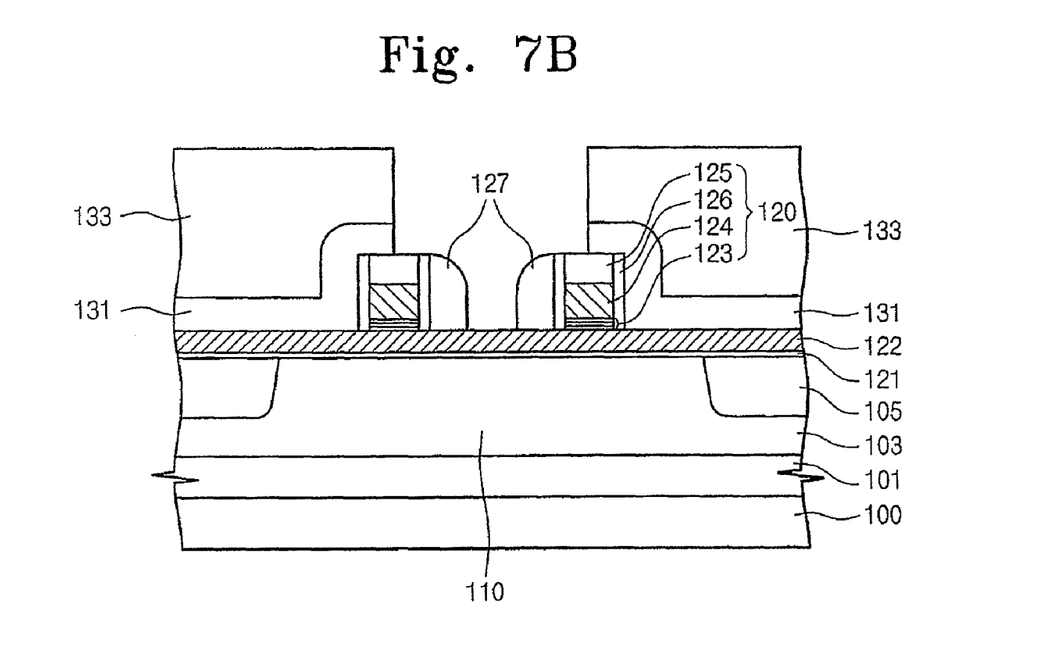

Referring to FIGS. 7A and 7B, an anti-oxidation layer is formed to cover the stack patterns 120 and the first conductive layer pattern 122. The anti-oxidation layer is formed of material having an etching selectivity with respect to the first sidewall spacer 126 and the mask insulation layer pattern 125 to prevent the first and second conductive layers from becoming oxidized. When the first sidewall spacer 126 and the mask insulation patterns 125 are formed of a silicon oxide layer, the anti-oxidation layer can comprise a silicon nitride layer or a silicon oxide nitride layer. A photoresist pattern 133 is formed on the anti-oxidation layer to expose a region between the pair of stack patterns 120. The anti-oxidation layer is anisotropically etched using the photoresist pattern 133 to form a pair of second sidewall spacers 127 on respectively inwardly opposed sidewalls of the pair of stack patterns 120, and to form an anti-oxidation pattern 131. The anisotropic etching is performed, for example, using a dry etching process. The pair of second sidewall spacers 127 and the anti-oxidation pattern 131 operate to cover and protect the first conductive layer 122 and the pair of stack patterns 120.

Figure 8A:
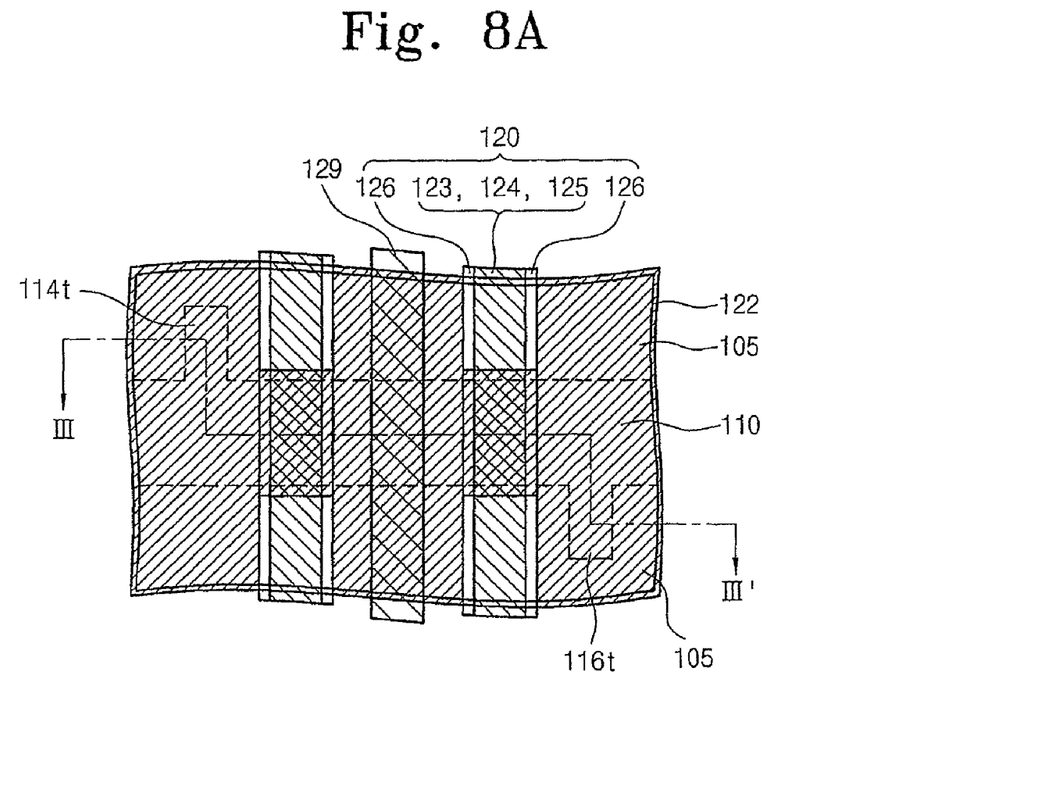
Figure 8B:
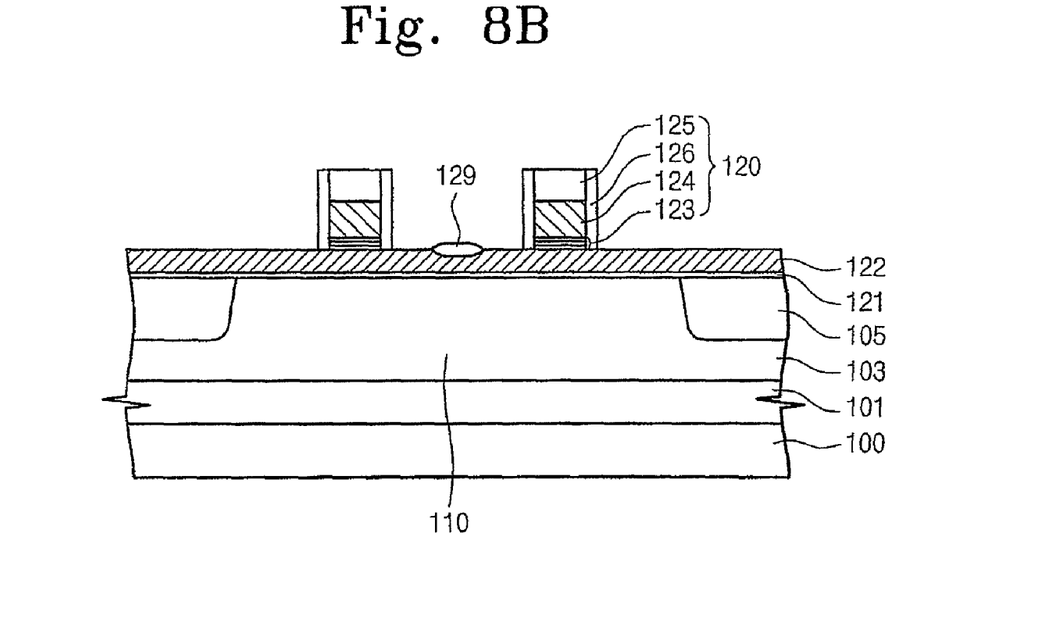

Referring to FIGS. 8A and 8B, a mask pattern 129 spaced a predetermined distance apart from the pair of stack patterns 120 is formed on the first conductive layer pattern 122 between the pair of stack patterns 120. The mask pattern 129 can be formed, for example, by performing a thermal oxidation process after removing the photoresist pattern 133 of FIGS. 7A and 7B. Accordingly, the surface of the first conductive layer pattern 122 exposed between the pair of second sidewall spacers 127 is thermally oxidized to form the mask pattern 129. In one embodiment, the mask pattern 129 is formed to a thickness of about 200 Å. The resulting mask pattern 129 has a middle portion of a thickness that is greater than that of the edge portions. The second sidewall spacers 127 are then optionally removed.

Figure 9A:
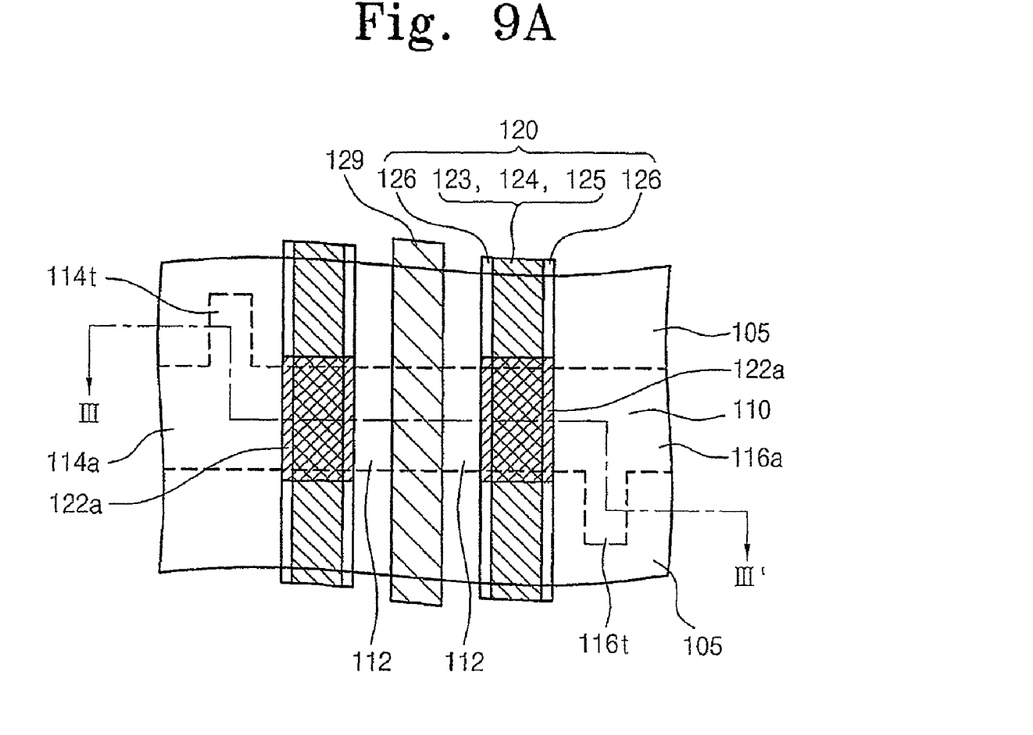
Figure 9B:
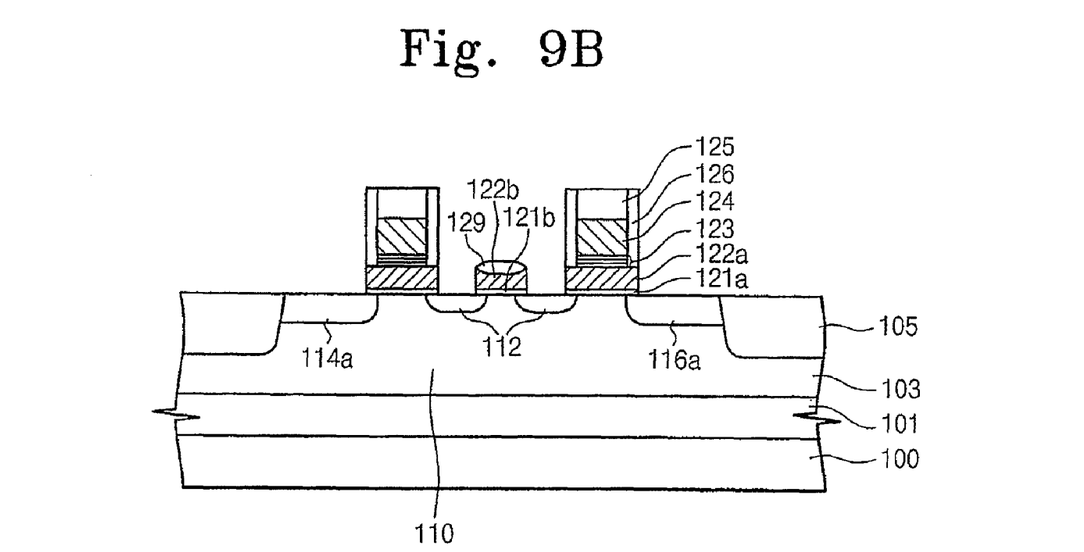

Referring to FIGS. 9A and 9B, the first conductive layer pattern 122 and the gate insulation layer 121 are patterned using the stack pattern 120 and the mask pattern 129 as an etching mask to form gate structures of a pair of nonvolatile memory transistors MT and the select transistor ST. The select transistor ST can be formed so as to be self-aligned to the pair of nonvolatile memory transistor MT without using an additional photolithography process. Therefore, since the gate of the select transistor ST can be formed in a length and in an interval that is smaller than what is obtainable by the photolithography limitation, the degree of the integration in a semiconductor device can be increased.

Second conductivity-type (n-type) impurity ions of a low-concentration can then be implanted on the active region 110. Accordingly, a floating diffusion region 112 may be formed on the active region 110 between the nonvolatile memory transistor MT and the select transistor ST, and low-concentration impurity regions 114a and 116a can be formed on the active region 110 at sides of the pair of nonvolatile memory transistors MT opposite the floating diffusion regions 112 as shown.

Figure 10A:
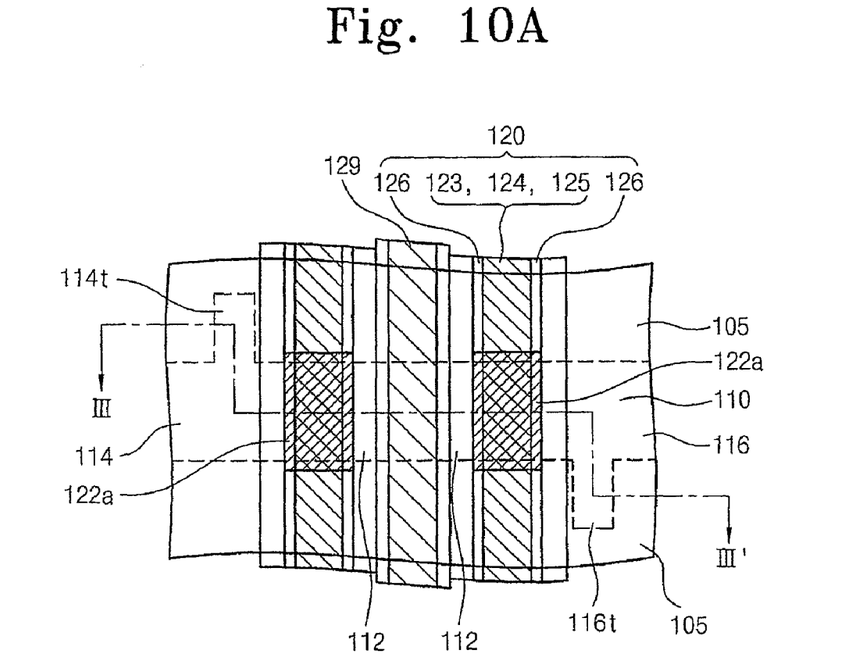
Figure 10B:
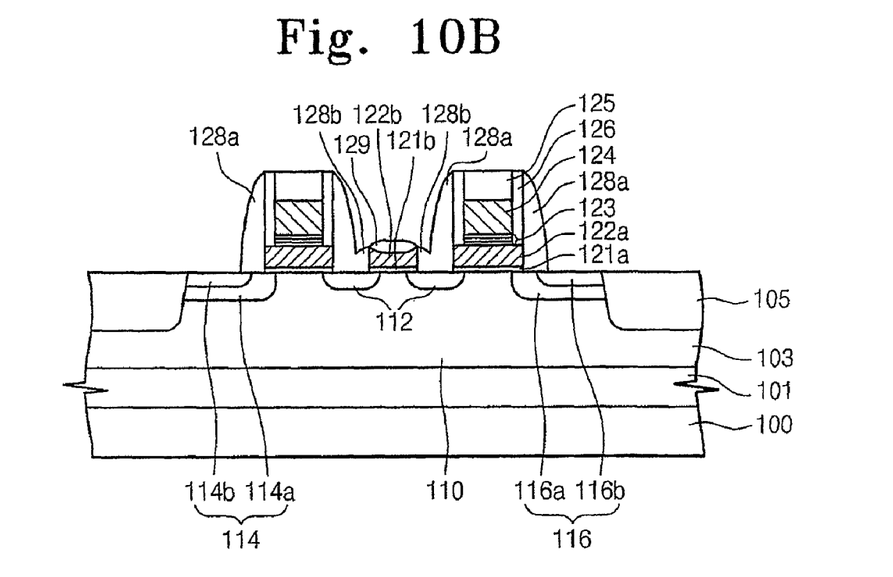

Referring to FIGS. 10A and 10B, a third sidewall spacer 128a can be formed on both sides of the pair of nonvolatile memory transistors, and a fourth sidewall spacer 128b can be formed on the both sides of the select transistor ST. The third sidewall spacer 128a and the fourth sidewall spacer 128b may be formed, for example, by depositing an insulation layer according to a CVD method and by performing a dry etching process. A portion of the third sidewall spacer 128a and the fourth sidewall spacer 128b can also cover the floating diffusion region 112.

Second conductivity-type (e.g., n-type) impurity ions of a high-concentration can then be implanted on the active region 110. High-concentration impurity regions 114b and 116b can be formed on the active region at outer sides of the pair of nonvolatile memory transistors MT. Accordingly, first and second drain regions 114 and 116 can be formed on the active region at outer sides of the pair of nonvolatile memory transistors. At this point, since the floating diffusion regions 112 may be covered by the third and fourth sidewall spacers, the high-concentration impurity ions are not implanted in the floating diffusion regions 112.

In a case where the extension parts 114t or 116t are disposed on the active region 110, such as in the case of FIG. 3 shown and described above, the n-type impurity ions of a high-concentration may be implanted to form an extended drain region.

Figure 11A:
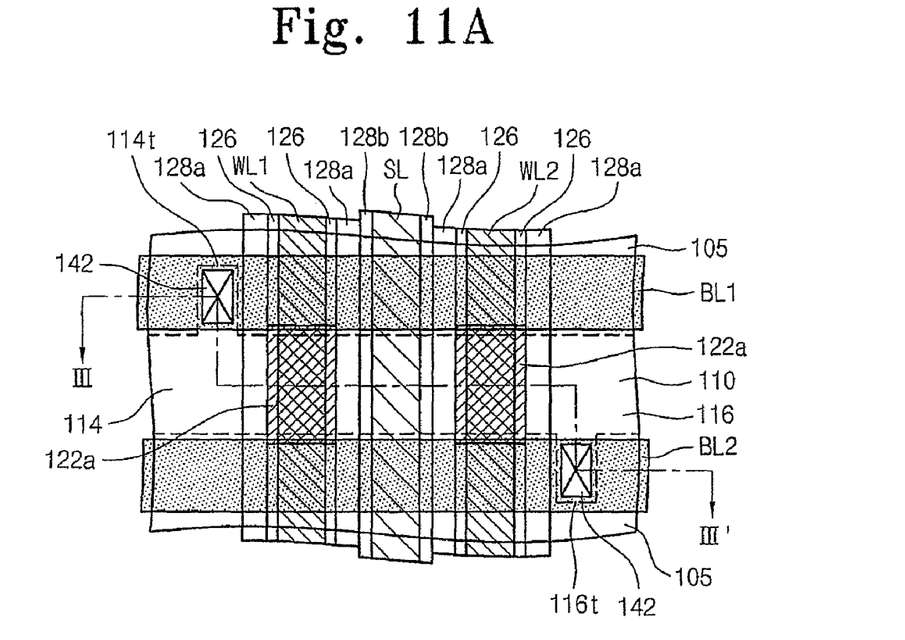
Figure 11B:
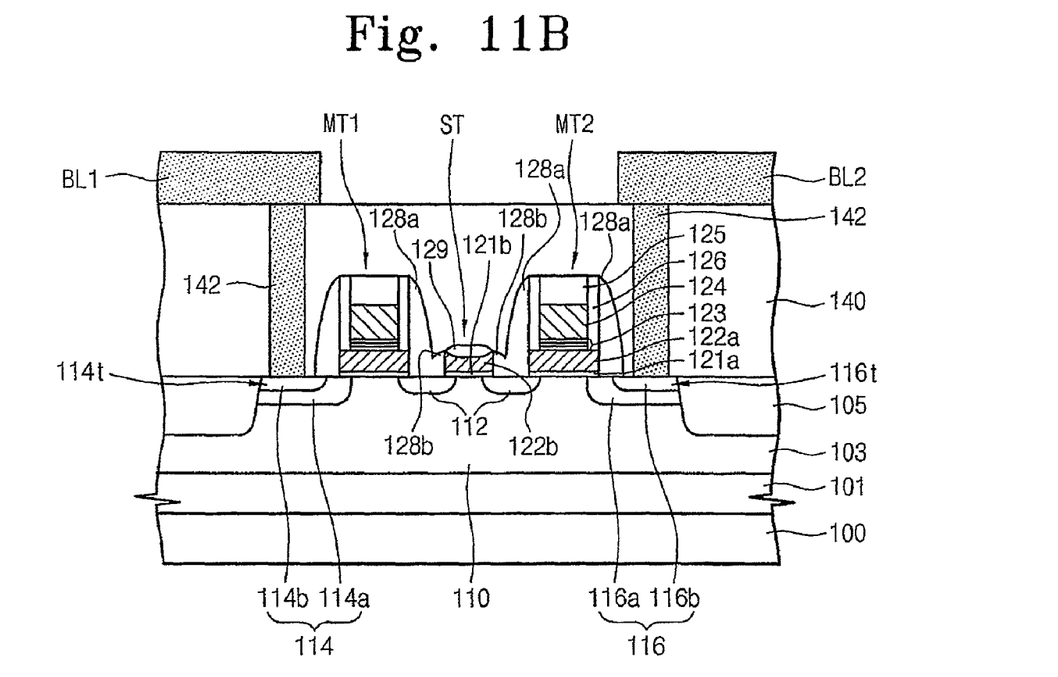

Referring to FIGS. 11A and 11B, an interlayer insulation layer 140 covering the resulting structure can be deposited, and bit line contact holes formed therein to expose the first and second drain regions 114, 116. Conductive materials (e.g., tungsten silicide and tungsten) filling the bit line contact holes may be deposited and planarized to form the bit line contact plugs 142. A metal line material may be deposited and patterned on the interlayer insulation layer 140 to form first and second bit lines BL1 and BL2 that are connected to the bit line contact plugs 142. The first and second bit lines BL1 and BL2 may be connected to the first and second extension parts 114t and 116t, respectively, through the bit line contact plugs 144 and may be formed to extend along the device isolation layer 105 defining the active region 110.

Since the memory cell unit of the EEPROM includes one select transistor ST and two nonvolatile memory transistors MT1, MT2, it may operate in a dual-bit configuration; a first bit of storage being achieved through the combination of the select transistor ST and a first of the two non-volatile memory transistors MT1, and a second bit of storage being achieved through the combination of the select transistor ST and a second of the two nonvolatile memory transistors MT2, The select transistor ST is thus operatively shared by the first and second memory transistors MT1, MT2 of each memory cell unit MC. Thus, the resulting device can be more highly integrated. Moreover, since the gates of the select transistors are self-aligned in the region between the nonvolatile memory transistors, it is possible to form the gates of the select transistors at a dimension that is less than that obtainable by the photolithography process used to form the device.

While embodiments of the invention have been particularly shown and described above, it will be understood by those skilled in the art that various changes in form and detail may be made herein without departing from the spirit and scope of the invention as defined by the appended claims.

What is claimed is:

1. A method of forming a nonvolatile memory device, the method comprising:

forming a device isolation layer defining an active region in a semiconductor substrate;

forming a gate insulation layer and a first conductive layer on the semiconductor substrate;

forming a pair of stack patterns, each having a intergate dielectric layer pattern and a second conductive layer pattern on the first conductive layer;

forming a mask pattern on the first conductive layer pattern between the stack patterns, the mask pattern being spaced apart from each of the stack patterns;

patterning the first conductive layer using the stack patterns and the mask patterns as an etching mask; and implanting impurity ions into the active region to form a pair of nonvolatile memory transistors and a select transistor.

2. The method of claim 1, wherein the mask pattern is spaced a same distance apart from each of the stack patterns of the pair of stack patterns.

3. The method of claim 1, wherein forming the first conductive layer further comprises forming a conductive layer pattern, comprising:

forming a first conductive layer on the gate insulation layer; and patterning the first conductive layer to form an opening on the device isolation layer in a region where the stack pattern is to be formed.

4. The method of claim 3, where forming the stack pattern comprises:

forming an insulation pattern on the second conductive layer pattern; and forming a first sidewall spacer at sidewalls of the intergate dielectric layer pattern, the second conductive layer pattern, and the insulation pattern.

5. The method of claim 4, wherein the first sidewall spacer is formed of an oxide layer.

6. The method of claim 4, wherein forming the mask pattern comprises:

forming second sidewall spacers at sidewalls of the pair of stack patterns to expose a portion of the first conductive layer pattern between the pair of stack patterns; and forming a thermal oxide layer on the surface of the exposed first conductive layer pattern using a thermal oxidation process.

7. The method of claim 6, wherein forming the second sidewall spacer comprises:

forming an anti-oxidation layer on the semiconductor substrate;

forming a photoresist pattern on the anti-oxidation layer to expose a region between the pair of stack patterns; and performing an anisotropic etching process on the anti-oxidation layer using the photoresist pattern.

8. The method of claim 7, wherein the anti-oxidation layer comprises a silicon nitride layer.

9. The method of claim 1, wherein the pair of nonvolatile memory transistors and the select transistor are arranged along a length direction of the active region, the active region having a extension part in at least one side of the one pair of nonvolatile memory transistors, the extension part extending in a second direction transverse the length direction.

10. The method of claim 9, wherein the extension part comprises two extension parts, and wherein the two extension parts extend in the second direction in respectively opposite directions.

* * * * *